United States Patent
Segawa et al.

(10) Patent No.: US 6,207,007 B1
(45) Date of Patent: Mar. 27, 2001

(54) PLASMA PROCESSING SYSTEM

(75) Inventors: Sumie Segawa, Naka-goma-gun; Toshiaki Makabe, 2-4-11, Shimotsuruma, Yamato-shi, Kanagawa-ken, both of (JP)

(73) Assignees: Tokyo Electron Limited, Tokyo-to; Toshiaki Makabe, Kanagawa-ken, both of (JP)

( * ) Notice: Subject to any disclaimer, the term of this patent is extended or adjusted under 35 U.S.C. 154(b) by 0 days.

(21) Appl. No.: 09/276,125

(22) Filed: Mar. 25, 1999

(30) Foreign Application Priority Data

Mar. 26, 1998 (JP) .................................................. 10-096931

(51) Int. Cl.[7] ............................. G01R 23/00; H01L 21/00
(52) U.S. Cl. ....................................... 156/345; 324/76.19
(58) Field of Search ........................ 118/723 E; 156/345; 324/127, 95, 126, 76.19, 76.22; 204/192.12, 192.13

(56) References Cited

U.S. PATENT DOCUMENTS 4,172,020 * 10/1979 Tisone et al. ................... 204/192.13
5,467,013 * 11/1995 Williams et al. .................... 324/127

OTHER PUBLICATIONS

Stevenson, et al, "A Plasma Process Monitor/Control System", Surface and Interface Analysis, vol. 26, 124–133, Jan. 1998.*
Wolf, et al, "Silicon Processing for the VLSI Era, vol. 1: Process Technology", Lattice Press,Sunset Beach, California, Jan. 1998.*

* cited by examiner

Primary Examiner—Gregory Mills
Assistant Examiner—Alva C Powell
(74) Attorney, Agent, or Firm—Smith, Gambrell & Russell, LLP

(57) ABSTRACT

A plasma processing system controls the electronegativity of a plasma produced by ionizing a process gas when processing a substrate by using the plasma. The relation between the pressure in a processing vessel (1) and the frequency of a RF power source (11'), and the electronegativity of the plasma produced by the agency of RF power is determined beforehand. A controller (18) adjusts the pressure in the processing vessel (1) and/or the frequency of the RF power source (11') in a real-time control mode by a feedback control operation on the basis of a pressure measured by a pressure sensor (17) and a frequency measured by a frequency meter (15) to adjust the electronegativity of the plasma to an appropriate value. The electronegativity of the plasma can be determined through simulation using a one-dimensional RCT model of the plasma.

8 Claims, 4 Drawing Sheets

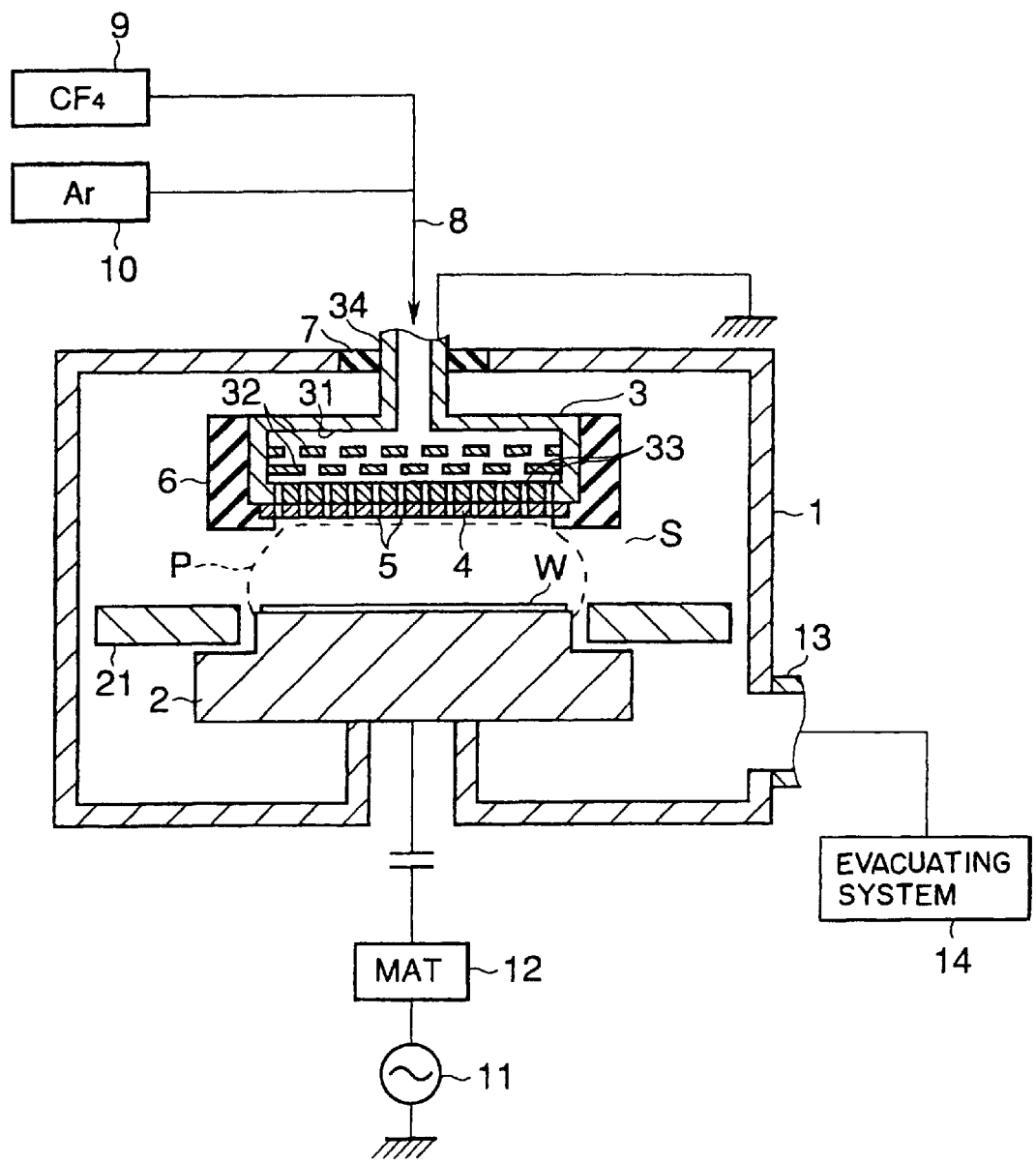
F I G. 1

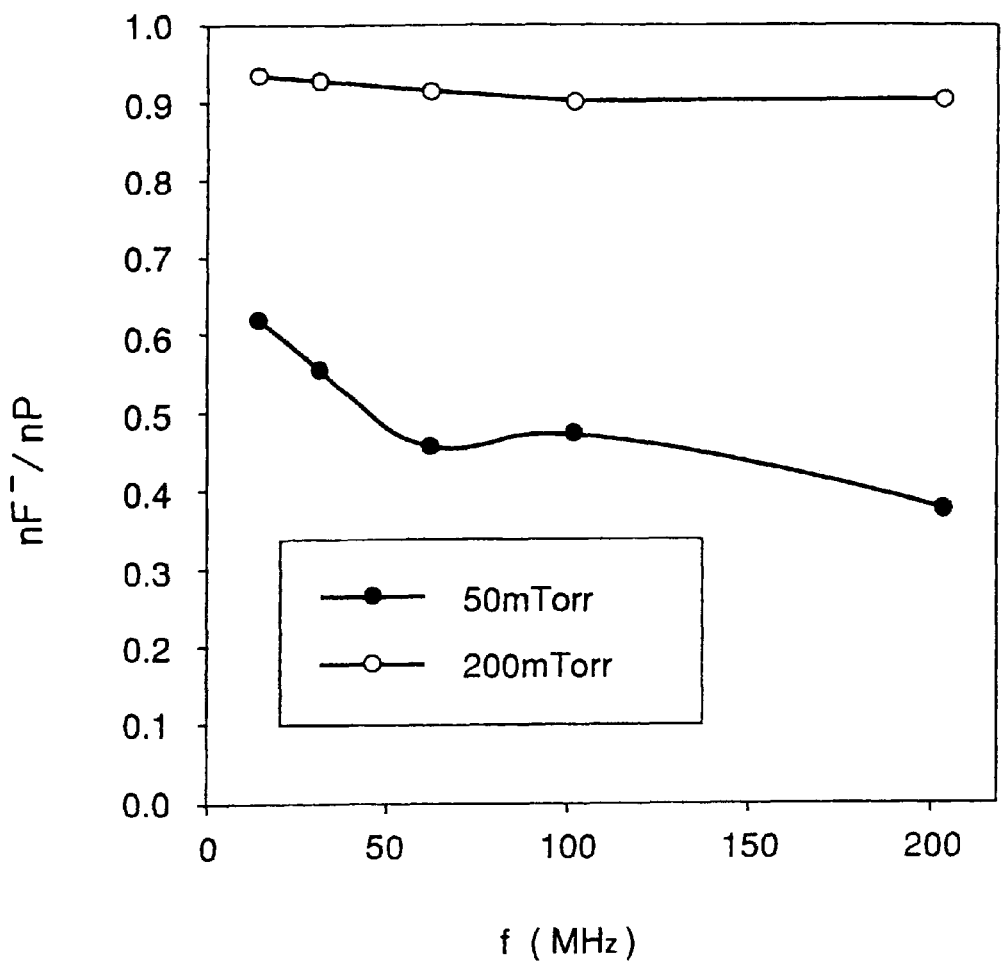
F I G. 2

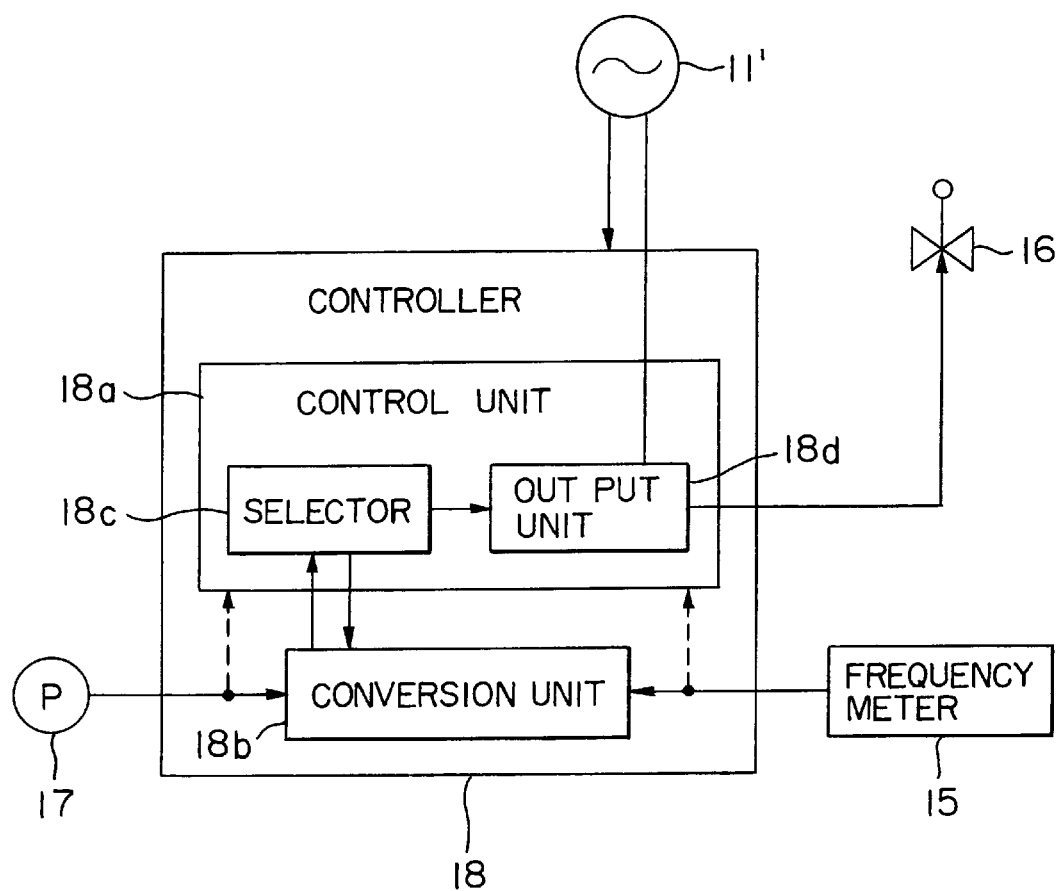
F I G. 4

PLASMA PROCESSING SYSTEM

BACKGROUND OF THE INVENTION

The present invention relates to a plasma processing system using a plasma of a process gas for processing a substrate such as a semiconductor wafer or the like by a plasma process, such as plasma etching process.

Minimum device dimensions specified by pattern rules have progressively been decreased with the ongoing miniaturization of semiconductor devices and the growth of the number of components per IC chip. Accordingly, fine etching techniques have become particularly indispensable to the fabrication of semiconductor devices. Integrated circuit fabrication processes that use plasma etching processes are most prevalent at present.

Generally, a RF capacitive coupled reactor is used to carry out a plasma etching process. A reactive ion etching system (RIE system), which applies a RF voltage to an electrode supporting a wafer and uses the physical actions of radicals and ions, is capable of highly anisotropic etching and is suitable for fine processing.

Incidentally, the reaction vessel of the RIE system needs to be maintained at a relatively high pressure of several hundreds mTorrs in view of achieving highly reactive etching. In such a reaction vessel, a relatively large amount of dust of reaction byproducts is produced, which tends to reduce the yield rate of semiconductor devices requiring fine processing.

High-energy ions impinge on a semiconductor wafer during the operation of a RIE process and thereby charge-up damage, i.e., the destruction of devices by charge-up, is liable to be caused.

Efforts have been made to determine appropriate process conditions through the simulation using various parameters to simulate the condition of a plasma. However, any plasma etching process using properly controlled plasma has not successfully been developed so far through the adjustment of the generally known parameters.

SUMMARY OF THE INVENTION

The present invention has been made in view of the foregoing circumstances and it is therefore an object of the present invention to provide a plasma processing system capable of properly controlling the condition of a plasma for a plasma process.

The inventors of the present invention have found through the examination of the foregoing problems that it is effective in more properly controlling the condition of a plasma for carrying out a plasma process to use the electronegativity of the plasma as a parameter.

Generally, when a process gas is ionized to produce a plasma, the plasma contains ions, electrons and radicals. It has been usual to simulate the condition of a plasma on an assumption that ions contained in the plasma are positive ions. Most plasma etching processes use an electronegative CF gas, such as $CF_4$. When such an electronegative CF gas is used, the plasma will contain negative ions in a considerably large number density. Therefore, it is impossible to know the condition of the plasma accurately on an assumption that all the ions are positive.

The present invention uses electronegativity indicating the rate of the number density of negative ions contained in a plasma as a new parameter to take into consideration the existence of negative ions in carrying out a plasma process, and a plasma processing system in accordance with the present invention controls the electronegativity of a plasma.

The ratio between the positive ion number density and the negative ion number density can properly be adjusted by controlling the electronegativity of a plasma, which may possibly eliminate charge-up damage to the wafer. There is some possibility that the pressure for a plasma process can be reduced by enhancing reactivity by controlling electronegativity so as to adjust the negative ion rate of the plasma to a predetermined value. If this technique is applied to a plasma etching process, finer processing can be expected.

Basically, a plasma process in accordance with the present invention can be carried out by a general RF capacitive coupled processing system provided with a RF power generator for generating RF power necessary for ionizing a process gas to produce a plasma, and a vessel in which a plasma process using the plasma of the process gas is carried out. The frequency of the RF power generator and the pressure in the vessel are adjusted to control the electronegativity of the plasma.

According to one aspect of the present invention, a plasma processing system for carrying out a plasma process for processing a wafer by using a plasma produced by ionizing a process gas comprises a processing vessel in which the plasma process is carried out; a process gas supply system for supplying a process gas into the processing vessel; an evacuating system for evacuating the processing vessel, an electrode disposed in the processing vessel; a RF power generating means for supplying RF power to the electrode to produce a plasma by ionizing the process gas in the vessel; and a control means previously storing data on the relation of the pressure in the processing vessel and the frequency of the RF power generating means with the electronegativity of a plasma produced by the agency of the RF power, and capable of controlling the pressure in the processing vessel and/or the frequency of the RF power generating means in a feedback control mode so that the electronegativity of the plasma may be adjusted to a predetermined proper value previously determined in accordance with conditions for the plasma process.

Any means for measuring the electronegativity of a plasma is not available at present, the electronegativity of a plasma has never been determined by simulation. The present invention achieves the determination of the electronegativity of a plasma by simulating the state of a plasma by a one-dimensional RCT model.

According to another aspect of the present invention, a plasma processing method of processing a substrate by using a plasma produced by ionizing a process gas comprises the steps of determining a predetermined, appropriate electronegativity of a plasma according to conditions for a plasma process; and regulating the electronegativity of the plasma so as to coincide with the predetermined, appropriate electronegativity during the plasma process.

According to the present invention, the electronegativity of the plasma is regulated while a wafer is being processed by the plasma process to maintain the plasma in an optimum state throughout the plasma process.

The plasma processing method of the present invention which regulates the electronegativity of a plasma is particularly effective in application to a general etching process using an electronegative CF gas.

BRIEF DESCRIPTION OF THE DRAWINGS

The above and other objects, features and advantages of the present invention will become more apparent from the following description taken in connection with the accompanying drawings, in which:

FIG. 1 is a schematic sectional view of a plasma etching system in a preferred embodiment according to the present invention;

FIG. 2 is a graph showing the dependence of the electronegativity of a $CF_4$ plasma on the frequency of driving frequency for pressures in a processing vessel, determined by the simulation of the $CF_4$ plasma using a one-dimensional RCT model;

FIG. 4 is a block diagram of a controller included in the plasma etching system shown in FIG. 3.

DESCRIPTION OF THE PREFERRED EMBODIMENTS

Figure 3:
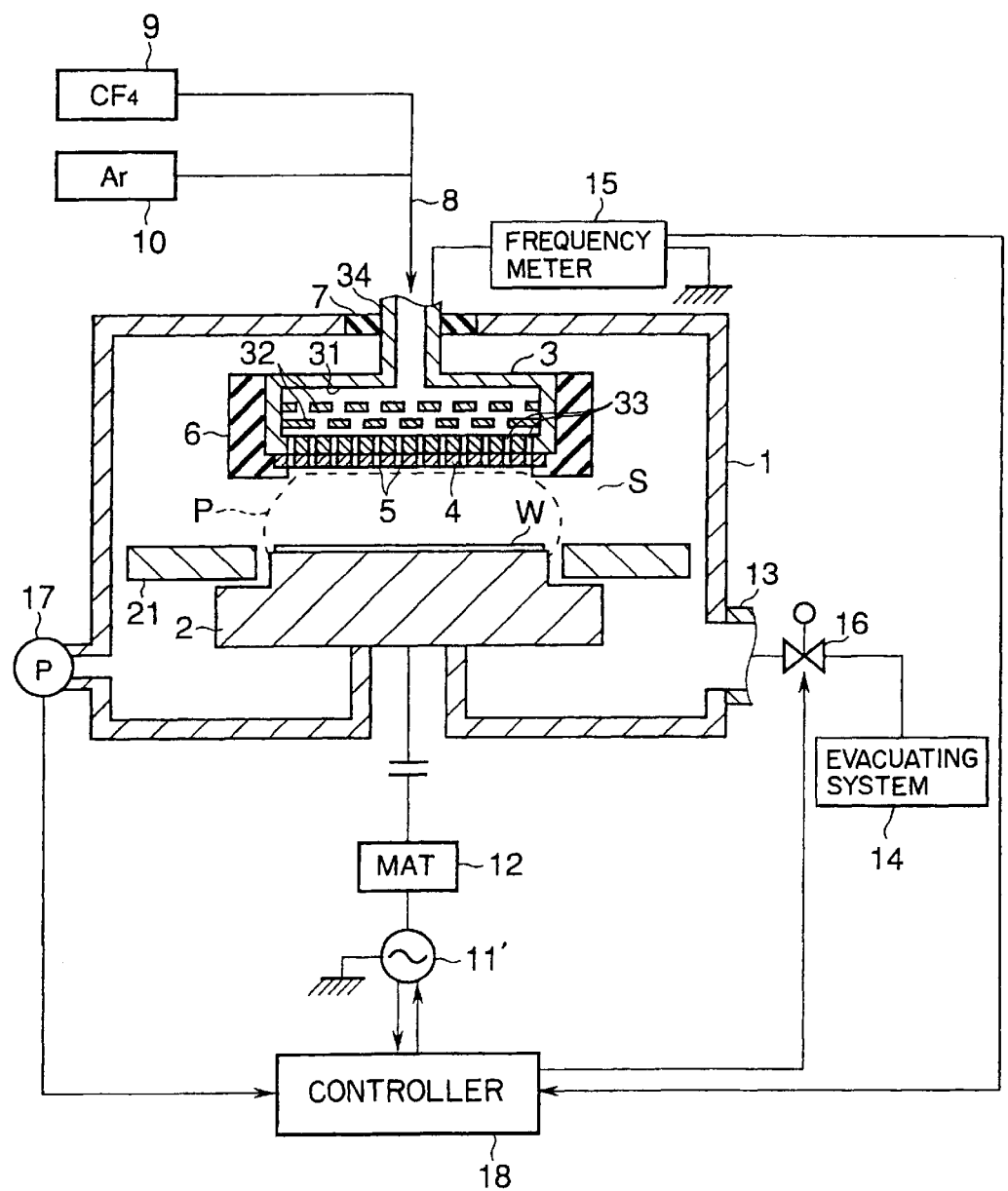
FIG. 3 is a schematic sectional view of a plasma etching system in a preferred embodiment according to the present invention.

Referring to FIG. 1 showing a plasma etching system in a preferred embodiment according to the present invention in a schematic sectional view, the plasma etching system has a hermetic cylindrical vessel 1. A support table 2 is placed in the vessel 1 to support a semiconductor wafer W, i.e., a substrate, thereon in a horizontal position. The support table 2 has the shape of a stepped cylindrical body. The semiconductor wafer W is fixed to the support table 2 by a suitable fixing means. An exhaust ring 21 is disposed so as to surround an upper reduced part of the support table 2.

A shower head 3 defining a space 31 is disposed near the top wall of the vessel 1 opposite to the support table 2. The shower head 3 is made of aluminum and has a bottom wall provided with a plurality of gas discharge holes 33. Two baffle plates 32 for diffusing gases are inserted in the space 31. A gas supply pipe 34 is connected to the top wall of the shower head 3 to deliver gases into the space 31. An electrode plate 4 of carbon or the like provided with a plurality of holes 5 is disposed in close contact with the outer surface of the bottom wall of the shower head 3 with the holes 5 coincided with the holes 33, respectively. The shower head 3 and the electrode plate 4 are surrounded by an electrically insulating protective ring 6 of a ceramic material or the like.

The gas supply pipe 34 of the shower head 3 is attached through an insulating member 7 to the top wall of the vessel 1. A gas supply pipe 8 has one end connected to the gas supply pipe 34 and the other end connected to pipes connected respectively to a $CF_4$ gas source 9 for supplying $CF_4$ gas, i.e., a process gas, and an Ar gas source 10 for supplying Ar gas, i.e., a diluent.

An exhaust port 13 is formed in a lower part of the side wall of the vessel 1. An evacuating system 14 is connected to the exhaust port 12 to evacuate the vessel 1 to a predetermined vacuum.

A RF power source (RF power generating means) 11 is connected through a matching circuit 12 to the support table 2, and the shower head 3 is grounded. The electrode plate 4 held in close contact with the lower surface of the shower head 3 serves as an upper electrode, and the support table w serves as a lower electrode. Thus, these components constitute a diode parallel plate RIE type RF capacitive coupled etching system.

The semiconductor wafer W is mounted on the support table 2 of the plasma etching system, the vessel is evacuated by a vacuum pump included in the evacuating system 14 to a vacuum in the range of $10^{-5}$ to $10^{-6}$ Torr, and then $CF_4$ gas and Ar gas are supplied at predetermined flow rates from the $CF_4$ gas source 9 and the Ar gas source 10, respectively, into the vessel 1 so that the vessel in the vessel 1 is set at a predetermined pressure. Subsequently, RF power of a predetermined frequency is supplied from the RF power source 11 to the support table 2, i.e., lower electrode. Consequently, an RF electric field S is created between the support table 2 and the electrode plate 4 to produce a plasma P by ionizing the process gas.

In this embodiment, the electronegativity of the plasma P, corresponding to the rate of the negative ion number density of the plasma P, is controlled during the etching process for etching a film, such as an oxide film formed on the semiconductor wafer W. The electronegativity of the plasma P can be understood through the simulation of the state of the plasma P by using a one-dimensional RCT model (Relaxation Continuum model).

Conditions were set for the analysis of a one-dimensional model provided with infinite parallel flat electrodes and modeling the RF capacitive coupled etching system, and the state of the plasma was simulated by using the RCT model (a fluid model) taking into consideration the relaxation time of electrons.

The RCT model is able to simulate accurately the behavior of charged particles following a RF electric field with a delay for the accurate determination of the electronegativity of the plasma. In this disclosure, the electronegativity of the plasma is expressed by $nF^-/nP$, where $nP$ is plasma number density and $nF^-$ is negative ion number density.

The simulation will concretely be explained below. In the one-dimensional model provided with the infinite parallel flat electrodes, the distance between the electrodes was 25 mm, driving voltage $V=V_0 \sin \omega t$ was applied to one electrode, and the other electrode was grounded. The pressure in the vessel was 50 mTorr or 200 mTorr. Driving frequency, i.e., the frequency of the RF power source 11, was varied in the range of between 13.56 to 200 MHz, and the voltage $V_0$ was determined so that the plasma number density $nP$ is kept substantially constant for all the driving frequencies. The characteristics of the $CF_4$ plasma were examined by using the RCT model.

It was found that the $CF_4$ plasma has a large vibrational excitation sectional area, which is a feature of molecular gases, negative ions stagnates in the vicinity of the boundary between an ion sheath and a bulk plasma because the $CF_4$ gas is an electronegative gas, and a double-layer electric field was created. It was found that a peak in the space-time distribution of ionization rate lies on a sheath on the side of the cathode, and the space-time distribution of electron attachment rate coincides well with the space-time distribution of electron number density.

It was found through the examination of the variation of the charged particle composition of the plasma with driving frequency at each pressure that the plasma contains positive and negative ions when the pressure is high, the rate of the electron number density tends to increases as the pressure decreases.

It was found that the electronegativity of the $CF_4$ plasma defined by $nF^-/nP$ and representing the charged particle composition of the $CF_4$ plasma is high when the driving frequency f is low and the pressure is high as shown in FIG. 2. As is obvious from FIG. 2, the electronegativity is relatively insensitive to driving frequency f and is greatly dependent on the pressure.

Since the relation between the electronegativity of the plasma, and, for example, the pressure in the vessel and the driving frequency can be determined on the basis of the facts found through the simulation, the electronegativity of the plasma can be controlled by adjusting the pressure in the vessel and/or the driving frequency.

Accordingly, the electronegativity of the plasma can be controlled to an optimum value determined through experiments by properly adjusting plasma producing conditions including the pressure in the vessel and/or the driving frequency. When processing a substrate by the plasma processing method using the plasma of the process gas, an appropriate set electronegativity is determined beforehand according to conditions for a plasma process, and the electronegativity of the plasma is controlled during the plasma process so as to coincide with the set electronegativity.

Thus, the ratio between the positive ion number density and the negative ion number density of the plasma can be regulated by properly controlling the electronegativity of the plasma. Consequently, charge-up damage to the substrate may be prevented. Reactivity may be enhanced, it may be possible to reduce the pressure for the etching process and the possibility of finer processing may be expected, when the electronegativity is controlled to adjust the negative ion concentration to a predetermined value.

Thus, the electronegativity of the plasma can be controlled by properly adjusting the pressure in the vessel and/or the driving frequency. The pressure in the vessel and the frequency of the RF power source can be adjusted so that the electronegativity of the plasma may be controlled to a desired value in a real time control mode with a plasma processing system provided with a variable-frequency RF power source.

A plasma etching system in a preferred embodiment according to the present invention will be described with reference to FIGS. 3 and 4, in which parts like or corresponding to those shown in FIG. 1 are designated by the same reference characters and the description thereof will be omitted.

The plasma etching system shown in FIG. 3 is basically the same in construction as that shown in FIG. 1. Referring to FIG. 3, the plasma etching system is provided with a variable-frequency RF power source 11', a frequency meter 15 is connected to the shower head 3 by a wire, a pressure sensor 17 is attached to the vessel 1, and a gate valve 16 provided with an automatic pressure regulator is placed in a pipe connected to the exhaust port 13. The frequency of the RF power source 11' and the gate valve 16 are controlled by a controller 18.

Referring to FIG. 4, the controller 18 has a control unit 18a including a selector 18c and an output unit 18d, and a conversion unit 18b. The output unit 18d of the control unit 18a provides control signals for controlling the frequency of the RF power source 11', and the gate valve 16. The conversion unit 18b or the control unit 18a receives signals provided by the frequency meter 15 and the pressure sensor 17.

The conversion unit 18b provides the relation between the pressure in the vessel 1 and the frequency of the RF power source 11', and the electronegativity of the plasma produced in the vessel 1. More specifically, the conversion unit 18b has a conversion table produced beforehand through simulation using the foregoing one-dimensional RCT model and showing the relation between the pressure in the vessel 1 and the frequency of the RF power source 11', and the electronegativity of the plasma produced by the agency of RF power. The conversion unit 18b may be provided with expressions (and a calculator) for calculating the electronegativity of the plasma on the basis of the pressure in the vessel 1 and the frequency of the RF power source 11' instead of the conversion table.

Then, the control unit 18a, given a desired electronegativity of the plasma, refers to the conversion unit 18b and controls the gate valve 16 and the RF power source 11' to adjust the pressure in the vessel 1 and the frequency of the RF power source 11' to the pressure and the frequency corresponding to the desired electronegativity, respectively. More specifically, the selector 18c refers to the conversion unit 18b to select a combination of a value for the pressure in the vessel 1 and a value for the frequency of RF power to be supplied by the RF power source 11', suitable for adjusting the electronegativity of the plasma to a electronegativity determined and input to the control unit 18a beforehand according to conditions for the plasma process, and the output unit 18d provides control signals for adjusting the pressure in the vessel 1 and the frequency of the RF power source 11' to the values selected by the selector 18c.

In this plasma processing system, the electronegativity of the plasma can be controlled in a real-time control mode through the feedback control of the gate valve 16 and the RF power source 11' so that the electronegativity of the plasma may be adjusted to the suitable electronegativity determined according to the conditions for the plasma process on the basis of the pressure in the vessel 1 measured by the pressure sensor 17, the frequency of the RF power measured by the frequency meter 15, and the conversion table (or the expressions) of the conversion unit 18b.

In a modification, either the pressure in the vessel 1 or the frequency of the RF power source 11' may be fixed and the other may be adjusted to adjust the electronegativity of the plasma to the desired value. If the pressure is fixed, the pressure sensor 17 is unnecessary. If the frequency is fixed, the frequency meter 15 is unnecessary. Thus, the value of the fixed parameter may be stored in the controller 18 or may be stored in a storage device to which reference can be made by the controller 18. The value of the variable parameter needs to be measured and the measured value of the variable parameter must be transferred to the controller 18 by a transfer means; that is, the plasma processing system may be provided with means for giving the values of the pressure in the vessel 1 and the frequency of the RF power source 11' beforehand or in a real-time mode to the controller 18.

The present invention is not limited in its practical application to the embodiments specifically described above and various modifications of the foregoing embodiments are possible. For example, the present invention is applicable to any plasma etching system other than the diode parallel plate RIE type etching system specifically described herein, and the present invention may use a process gas other than $CF_4$ gas. The present invention is also applicable to any plasma processes other than the plasma etching process specifically described herein. Determination of the state of the plasma necessary for determining the electronegativity of the plasma may be achieved by a method other than that using the one-dimensional RCT model employed in the foregoing embodiments. The present invention is applicable not only to processing semiconductor wafers, but also to processing substrates other than semiconductor wafers, such as substrates for LCDs.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A plasma processing system for carrying out a plasma process for processing a substrate by using a plasma produced by ionizing a process gas, said plasma processing system comprising:

a processing vessel;

a process gas supply system for supplying a process gas into the processing vessel;

an evacuating system for evacuating the processing vessel;

an electrode disposed in the processing vessel;

a RF power generating means for supplying RF power to the electrode to produce a plasma by ionizing the process gas in the processing vessel;

a pressure sensing means for measuring pressure in the processing vessel;

a frequency measuring means for measuring the frequency of the RF power generated by the RF power generating means;

a conversion means for relating the pressure in the processing vessel and the frequency of the RF power with the rate of the negative ion number density of the plasma produced in the processing vessel; and a control means for controlling the pressure in the processing vessel and the frequency of the RF power with reference to the conversion means so that the rate of the negative ion number density of the plasma is adjusted to a value.

2. The plasma processing system according to claim 1, wherein the conversion means has a conversion table or expressions produced through simulation using a one-dimensional RCT model of the plasma.

3. The plasma processing system according to claim 1, wherein the control means keeps the frequency of the RF power unchanged and changes the pressure in the processing vessel.

4. The plasma processing system according to claim 1, wherein the control means changes both the pressure in the processing vessel and the frequency of the RF power.

5. A plasma processing system for carrying out a plasma process for processing a substrate by using a plasma produced by ionizing a process gas, said plasma processing system comprising:

a processing vessel;

a process gas supply system for supplying a process gas into the processing vessel;

an evacuating system for evacuating the processing vessel;

an electrode for ionizing the process gas in the processing vessel;

a RF power generating means for supplying RF power to the electrode to produce a plasma by ionizing the process gas in the processing vessel;

a conversion means for relating the pressure in the processing vessel and the frequency of the RF power with the electronegativiy of the plasma produced in the processing vessel; and a control means for on trolling at least either the pressure in the processing vessel or the frequency of the RF power with reference to the conversion means so that the electronegativiy of the plasma is adjusted to a value, where the electronegativiy of the plasma is negative ion number density/plasma number density.

6. A controller for controlling a plasma processing system for processing a substrate by a plasma process using a plasma produced by RF power in a processing vessel, said controller comprising:

a conversion means for relating the pressure in the processing vessel and the frequency of the RF power with the rate of the negative ion number density of the plasma produced in the processing vessel;

a selecting means for selecting a combination of a value for the pressure in the processing vessel and a value for the frequency of the RF power, suitable for adjusting the rate of the negative ion number density of the plasma to a value determined beforehand according to conditions for the plasma process; and an output means for providing control signal for adjusting the pressure in the vessel and/or the frequency of the RF power to the values selected by the selecting means.

7. The controller according to claim 6, wherein the conversion means has a conversion table or expressions produced through simulation using a one-dimensional RCT model of the plasma.

8. The controller according to claim 6, wherein the output means provides control signal for adjusting the pressure in the vessel while the frequency of the RF power is kept unchanged.

* * * * *